United States Patent
Lee et al.

(10) Patent No.: US 8,243,540 B2
(45) Date of Patent: Aug. 14, 2012

(54) SEMICONDUCTOR MEMORY DEVICE AND TEST METHOD THEREOF

(75) Inventors: Hyong-yong Lee, Suwon-si (KR); Chan-sub Jun, Asan-si (KR)

(73) Assignee: Samsung Electronics, Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/137,768

(22) Filed: Sep. 12, 2011

(65) Prior Publication Data

US 2012/0014189 A1    Jan. 19, 2012

Related U.S. Application Data

(62) Division of application No. 12/071,552, filed on Feb. 22, 2008, now Pat. No. 8,036,052.

(30) Foreign Application Priority Data

Feb. 22, 2007 (KR) ......................... 10-2007-0018053

(51) Int. Cl.
*G11C 7/00* (2006.01)
(52) U.S. Cl. ....................................................... 365/201
(58) Field of Classification Search .................... 365/201
See application file for complete search history.

(56) References Cited

U.S. PATENT DOCUMENTS

| | | | |
|---|---|---|---|
| 7,546,497 B2 | 6/2009 | Jang | |
| 2004/0246801 A1* | 12/2004 | Lee et al. | 365/221 |

FOREIGN PATENT DOCUMENTS

| KR | 10-2002-0080088 | 10/2002 |
|---|---|---|
| KR | 10-2003-0056117 | 7/2003 |
| KR | 10-2004-0093801 | 11/2004 |
| KR | 10-2004-0104903 | 12/2004 |
| KR | 10-2006-0015208 | 2/2006 |
| KR | 10-2006-0121523 | 11/2006 |

OTHER PUBLICATIONS

Korean Notice of Allowance dated May 26, 2009 for corresponding Korean Application No. 10-2007-0018053.
Korean Office Action dated Feb. 21, 2008 issued in corresponding Korean Application No. 10-2007-0018053.

* cited by examiner

*Primary Examiner* — Hoai V Ho
*Assistant Examiner* — Anthan Tran
(74) *Attorney, Agent, or Firm* — Harness, Dickey & Pierce, PLC

(57) ABSTRACT

Example embodiments disclose a semiconductor memory device and a test method thereof. The semiconductor memory device includes a memory cell array that provides first and second data groups at a first data rate and an output circuit, in a normal mode of operation, serially outputs the first and second data groups at a first data rate on an external terminal. In a test mode of operation, the output circuit outputs the first data group or the second data group at a second data rate on the external terminal in response to control signals, without switching the test mode. The second data rate may be lower than the first data rate.

5 Claims, 9 Drawing Sheets

SEMICONDUCTOR MEMORY DEVICE AND TEST METHOD THEREOF

CROSS-REFERENCE TO RELATED APPLICATIONS

This U.S. non-provisional patent application is a divisional of U.S. application Ser. No. 12/071,552, filed Feb. 22, 2008 (now U.S. Pat. No. 8,036,052), which claims priority under 35 U.S.C. §119 to Korean Patent Application No. 10-2007-0018053 filed on Feb. 22, 2007 in the Korean Intellectual Property Office (KIPO), the entire contents of each of which are incorporated herein by reference.

BACKGROUND

1. Field

Example embodiments are directed to a semiconductor memory device and a test method thereof.

2. Description

Semiconductor memory devices are used in various fields and the most widely used memory device is the Dynamic Random Access Memory (DRAM). Dual Data Rate Synchronous DRAM (DDR SDRAM) may write and read data in response to a rising and falling edges of a clock signal and may therefore operate at a high frequency.

Figure 1:
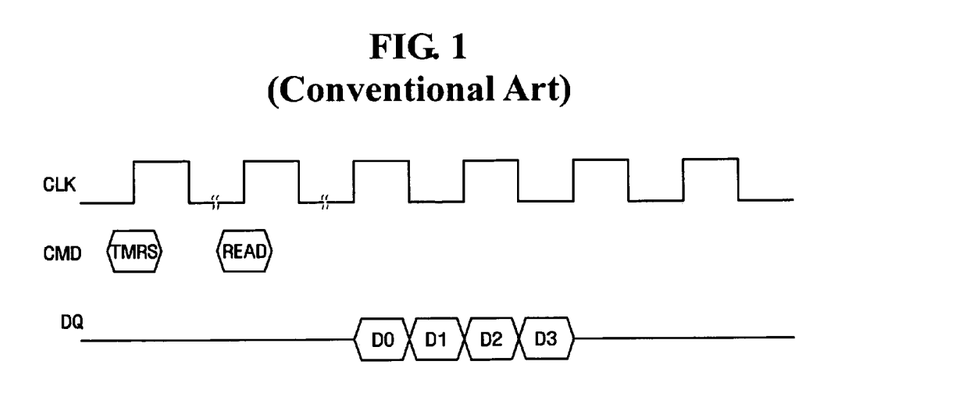
FIG. 1 is a timing diagram illustrating a normal operation of a conventional art DDR SDRAM.
Figure 2:
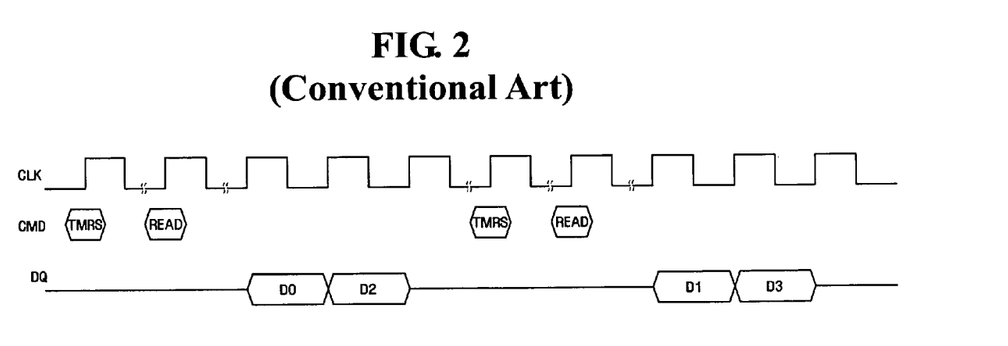
FIG. 2 is a timing diagram illustrating a test operation of a conventional art DDR SDRAM.

FIG. 1 is a timing diagram illustrating a normal mode of operation of DDR SDRAM in the conventional art. FIG. 1 illustrates a JEDEC compliant normal mode of operation involving a burst length of four data bits D0-D3. FIG. 2 is a timing diagram illustrating a test operation of DDR SDRAM in the conventional art.

Referring to FIG. 1, when a READ is input, each bit D0-D3 of a four bit data may be output from a semiconductor memory device in response to a rising and falling edge of a clock signal CLK.

Generally, increase in the frequency of clock signal CLK may cause decrease in clock signal pulse width and width of data bits D0-D3 may decrease. Therefore, it is difficult to read data during test operation and detect errors. In an attempt to overcome the above problems, a High Speed Data (HSD) test mode has been introduced, in which the width of each bit may be increased to at least twice its width during normal operation.

HSD may be explained with reference to FIG. 2. A Test Mode Register Set (TMRS) may set a first test mode during which, when a READ command is input, a first data group, for example even numbered data bits comprising D0, D2, etc., is output. TMRS may then set a second test mode during which, when a READ command is input a second data group, for example odd numbered data bits comprising D1, D3, etc., is output. Since, the width of each data bit in the High Speed Data (HSD) test mode may be increased to at least twice its width in normal operation, the data rate may be reduced during the test operation.

Thus, the data groups, for example the first and/or second data group may be tested through a test mode setting through TMRS. Although the high speed data test mode may increase reliability in test, it also may require more time and may reduce productivity.

SUMMARY

Example embodiments are directed to a semiconductor memory device and methods of test thereof.

In at least one example embodiment, a semiconductor memory device may include a memory cell array and an output circuit. The memory cell may output a first and/or a second data group at a first data rate in parallel. The output circuit, in a normal operation, may serially output the first and/or the second data group at the first data rate to an external terminal in response to control signals. In a test operation, the output circuit may serially output the first data group and/or the second data group at a second data rate, to the external terminal in response to control signals, the second data rate being lower than the first data rate, without switching the test mode of operation.

According to another example embodiment, a semiconductor memory device may include a memory cell array and an output circuit. The memory cell array may output a first and/or a second data group at a first data rate in parallel. The output circuit, in a normal operation, may serially output the first and/or the second data group at the first data rate to an external terminal in response to control signals. The output circuit, in response to control signals, in a first test mode may output the first data group at a second data rate, in a second test mode may output the second data group at the second data rate or in a third test mode the output circuit may output the first data group or the second data group at the second data rate, the second data rate in the first, second and the third test modes being lower than the first data rate.

A test method of a semiconductor memory device including a memory cell array and an output circuit, according to an example embodiment, may comprise providing a semiconductor memory device including a memory cell array and an output circuit, outputting from the memory cell array to the output circuit a first and a second data group at a first data rate, and outputting from the output circuit on an external terminal, in at least one test mode of operation, the first data group or the second data group at a second data rate without switching the test mode of operation.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted. In the figures:

DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless explicitly stated otherwise, all of the terminologies (including technical and scientific terminologies) used herein may be used as meaning that those skilled in the art can commonly understand. Further, terminologies defined in ordinary dictionaries should not be ideally or excessively construed, unless explicitly stated otherwise.

A terminology, "data rate" indicates the number of bit transmitted from a semiconductor memory device to an external terminal or from an external terminal into a semiconductor memory device, per clock cycle.

Figure 3:
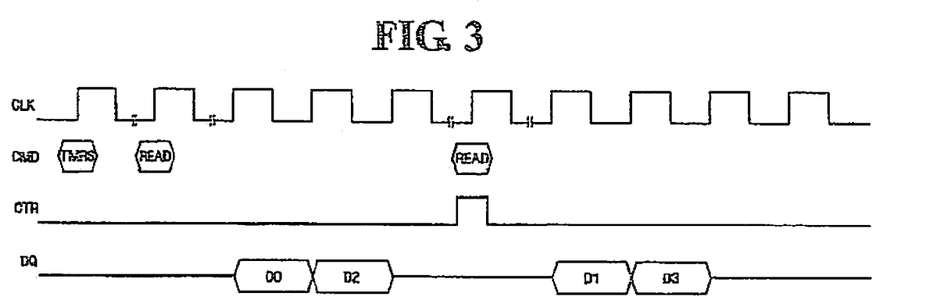
FIG. 3 is a timing diagram illustrating test operations of a semiconductor memory device according to an example embodiment.

FIG. 3 is a timing diagram illustrating test operations of semiconductor memory devices according to an example embodiment. FIG. 3 illustrates a high speed data test mode (HSD), wherein width of a bit in the test operation may be twice the width of the bit in normal operation.

Referring to FIG. 3, semiconductor memory devices according to an example embodiment may output a first data group, for example even numbered data group D0, D2, etc. or a second data group, for example odd numbered data group D1, D3, etc. without switching a test mode in test operation.

According to as illustrated in FIG. 3, after a test mode is set through TMRS, a first READ may be input and a first data group, for example data group D0, D2, may be output. Subsequently, a second READ may be input and a second data group, for example data group D1, D3, may be output, without switching the test mode. According to an example embodiment, logic levels of a control signal CTR may determine whether the first data group (EDATA) or the second data group (ODATA) is output. For example, the first data group D0, D2 may be output when the control signal CTR at a first logic level, for example low logic level, and the second data group D1, D3 may be output when the control signal CTR is at a second logic level, for example high logic level.

Address signal ADDR may be used as the control signal CTR, but other input signals to the semiconductor memory device may be also be used.

As described above, it may be possible to reduce test time when the first data group and the second data group are sequentially tested. Table 1, shown below, compares the test times of a semiconductor device in a normal operation (FIG. 1), according to a conventional art method (FIG. 2), and according to a test method in an example embodiment (FIG. 3).

TABLE 1

| | Test Method | Test Time | Compared |
|---|---|---|---|
| 1 | Normal operation | 2.9 sec | |
| 2 | Conventional Art | 5.8 sec | 5.8/2.9 = 2 |
| 3 | An Example Embodiment | 3.2 sec | 3.2/2.9 = 1.1 |

As seen from the Table 1, the test time according to the method in the conventional art is about two times that of in the normal operation, whereas the test time according to the method in the example embodiment is about 1.1 times that of in the normal operation. Therefore, it can be seen that it is possible to considerably reduce the test time in the test method according to the example embodiment.

A semiconductor memory device according to an example embodiment is now described below with reference to FIGS. 4 to 9.

Figure 4:
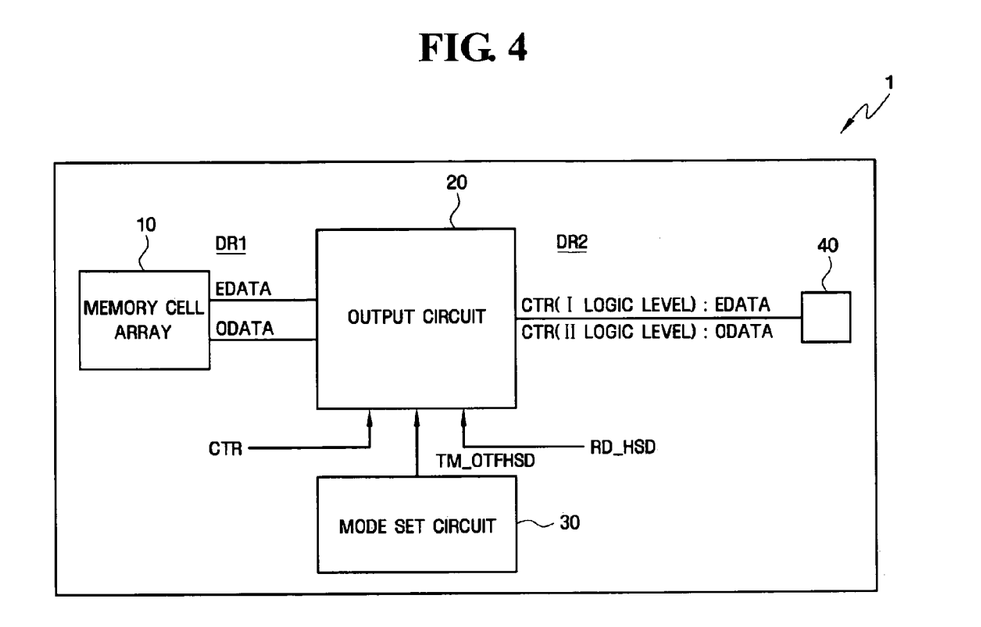
FIG. 4 is an example block diagram illustrating a semiconductor memory device according to an example embodiment.
Figure 5:
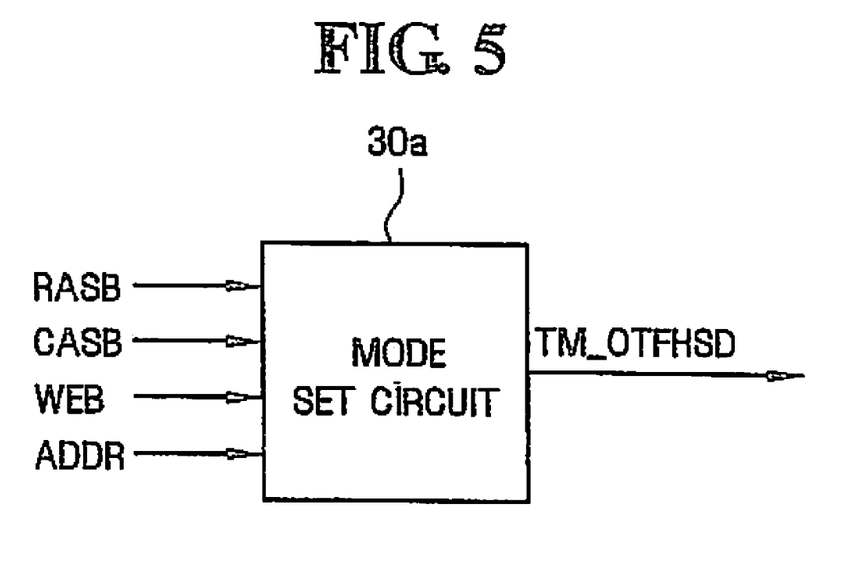
FIG. 5 is an example block diagram illustrating in detail the mode set circuit of FIG. 4.
Figure 6:
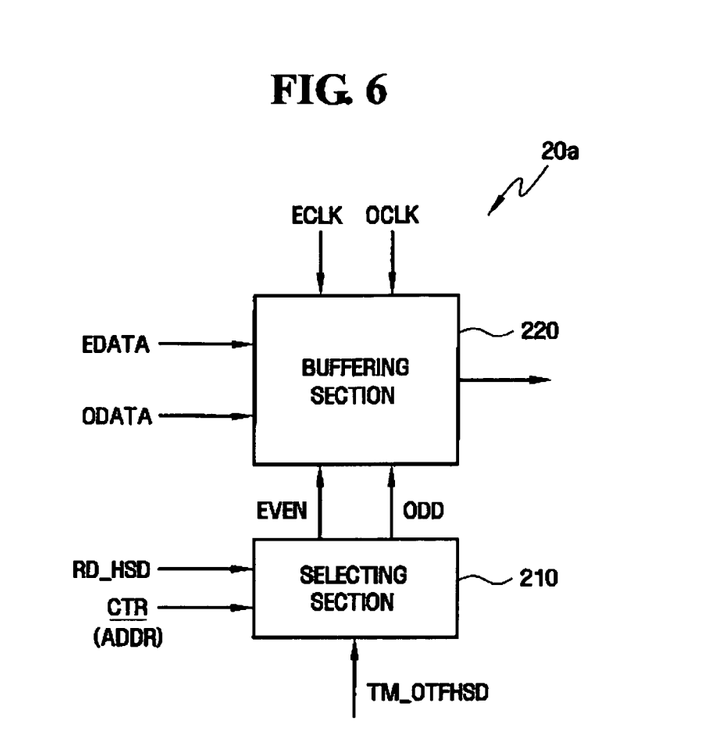
FIG. 6 is an example block diagram illustrating in detail the output circuit of FIG. 4.
Figure 7:
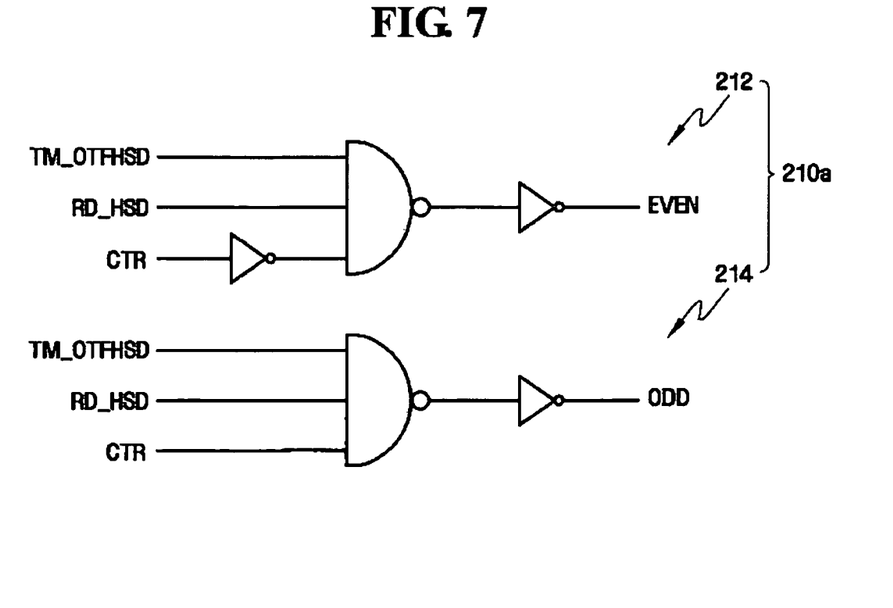
FIG. 7 is an example circuit diagram of the selecting section of FIG. 6.
Figure 8:
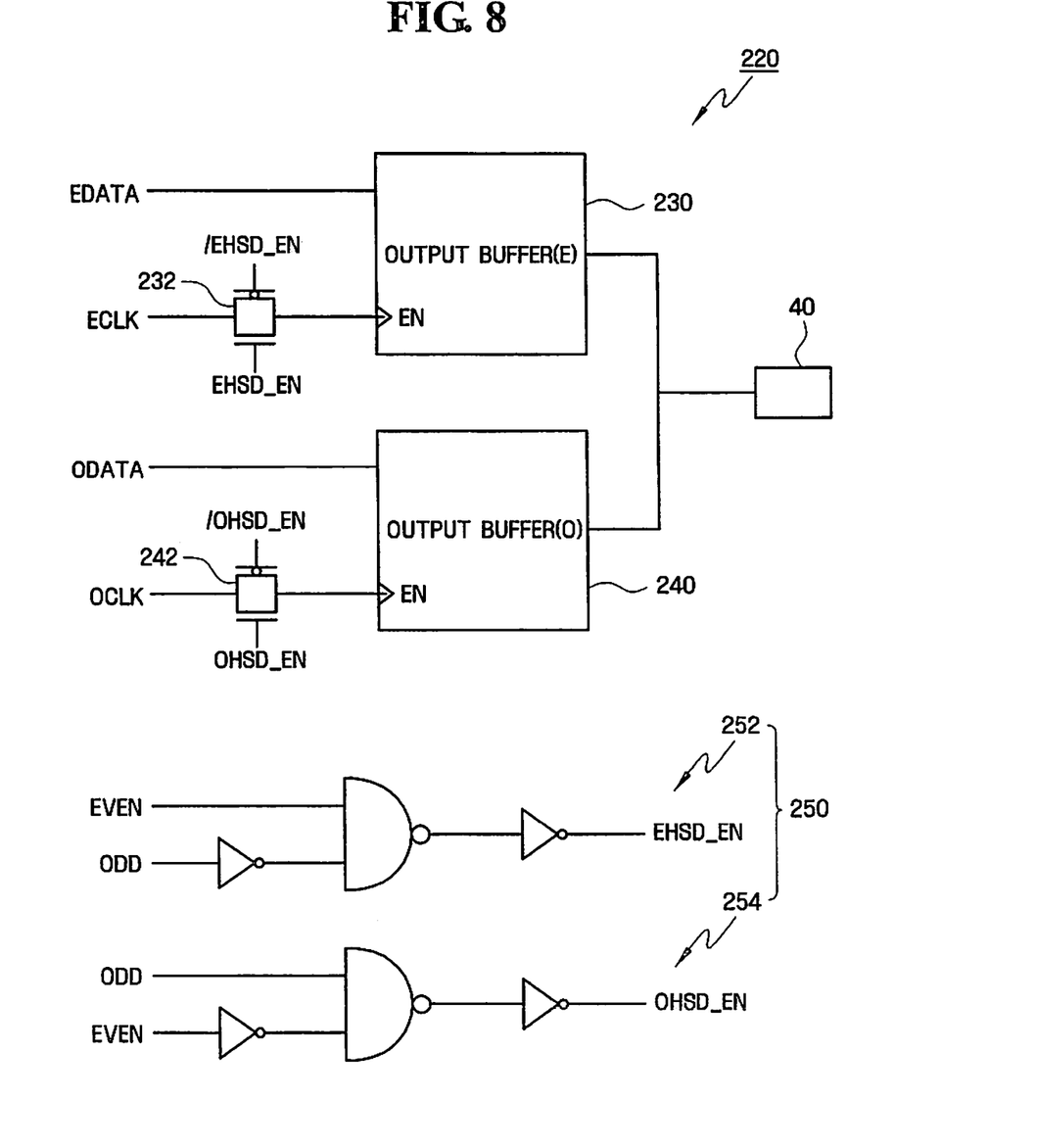
FIG. 8 is an example circuit diagram of the buffering section of FIG. 6.
Figure 9:
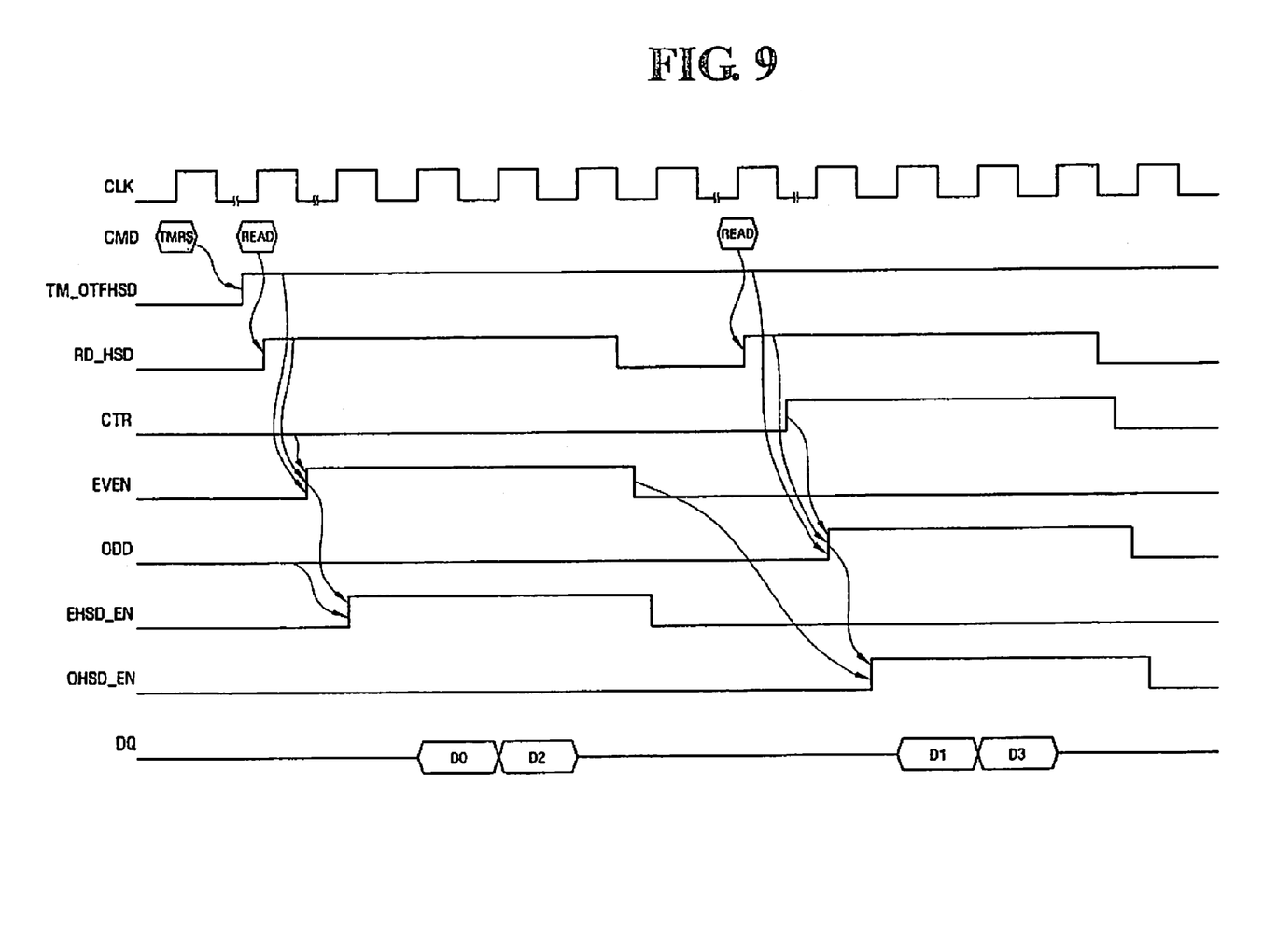
FIG. 9 is a timing diagram illustrating the operation of the semiconductor memory device according to an example embodiment.

FIG. 4 is a block diagram of a semiconductor memory device according to an example embodiment. The block diagram of FIG. 4 is an example block diagram for embodying the timing diagram of FIG. 3 and it will be obvious to one of ordinary skill in the art to embody FIG. 3 using other embodiments. FIG. 5 is an example block diagram illustrating the mode set circuit of FIG. 4 and FIG. 6 is an example block diagram illustrating the output circuit of FIG. 4. FIG. 7 is an example circuit diagram of the selecting section of FIG. 6 and FIG. 8 is an example circuit diagram of the buffering section of FIG. 6. FIG. 9 is a timing diagram illustrating the operation of the semiconductor memory device according to an example embodiment.

Referring to FIG. 4, a semiconductor memory device 1, according to an example embodiment; may include a memory cell array 10, an output circuit 20, a mode set circuit 30, and an external terminal 40.

The memory cell array 10 may output the first and the second data groups EDATA and ODATA in parallel at a first data rate DR1. The configuration of the memory cell array 10 is well known to those skilled in the art, and is therefore not described in detail herein.

The mode set circuit 30a, as shown in FIG. 5, may provide a test mode signal TM_OTFHSD that may determine a test mode for the output circuit 20 in response to a plurality of signals RASB, CASB, WEB, ADDR. In a test mode, the test mode signal TM_OTFHSD may be at a first logic level, for example a high level.

In a normal operation, the output circuit 20 may serially output the first and second data groups EDATA and ODATA at the first data rate DR1 on the external terminal 40. In a test operation, the output circuit 20 may output the first data group EDATA or the second data group ODATA at a second data rate DR2 on the external terminal 40 in response to the control signal CTR, test mode signal TM_OTFHSD and an internal read signal RD_HSD, without switching the test mode. The second data rate DR2 may be lower than the first data rate DR1.

For example, the control signal CTR may be the address signal ADDR, but is not limited thereto. The first data group EDATA may be output for a first logic level, for example a low-level, of control signal CTR and the second data group ODATA may be output for a second logic level, for example a high-level, of control signal CTR.

Referring to FIG. 6, the output circuit 20a may include a selecting section 210 and a buffering section 220.

The selecting section 210 may output selection signals EVEN, ODD for selecting the first data group EDATA or the second data group ODATA in response to the control signal CTR, the test mode signals TM_OTFHSD, and the internal read signal RD_HSD. The internal read signal RD_HSD may be a signal generated by a READ input in the test operation. The internal read signal RD_HSD may be, for example, a high-level signal in the read operation.

As shown in FIG. 7, the selecting section 210a may include a first sub-selecting section 212 and a second sub-selecting section 214.

The first sub-selecting section 212 may provide a first selection signal EVEN that may be obtained through a NAND-operation of an inverted signal of the control signal CTR, the test mode signal TM_OTFHSD, and the internal read signal RD_HSD. The second sub-selecting section 214 may provide a second selection signal ODD that may be obtained through a NAND-operation of the control signal CTR, the test mode signal TM_OTFHSD, and the internal read signal RD_HSD.

When the control signal CTR may be at the first logic level, for example a low level, the test mode signal TM_OTFHSD may be at a second logic level, for example a high level, and the internal read signal RD_HSD may also be at a second logic level, for example a high level, the first selection signal EVEN may reach a second logic level, for example a high level and the second selection signal ODD may reach a first logic level, for example a low level. On the contrary, when the control signal CTR may be at the second logic level, for example a high level, the first selection signal EVEN may reach a first logic level, for example a low level and the second selection signal ODD may reach a second logic level, for example a high level.

Referring to FIG. 6, the buffering section 220 may output data groups EDATA, ODATA in response to the selection signals EVEN and ODD. The buffering section 220 may output the first data group EDATA in response to a first internal clock ECLK and a second logic level of a first selection signal, for example a high level of the selection signal EVEN. The buffering section 220 may output the second data group ODATA in response to a second internal clock OCLK and a second logic level of a second selection signal, for example a high level of the selection signal ODD. The frequency of the first and second internal clocks ECLK, OCLK may be twice that of the clock signal CLK. The first and second internal clocks ECLK, OCLK may differ in phase by 90°, but the phase difference is not limited thereto.

The buffering section 220, as shown in FIG. 8, may include a first and a second output buffer 230, 240, a calculating section 250, and a first and a second transmitting section 232, 242.

The calculating section 250 may generate enable signals EHSD_EN and OHSD_EN in response to the selection signals EVEN and ODD. The first enable signal EHSD_EN may be generated by a NAND-operation of the first selection signal, for example selection signal EVEN, and a signal obtained by inverting the second selection signal, for example selection signal ODD. The second enable signals OHSD_EN may be generated by a NAND-operation of the second selection signal, for example selection signal ODD, and a signal obtained by inverting the first selection signal, for example selection signal EVEN.

Accordingly, assuming the first selection signal EVEN is at a high level and the second selection signal ODD is at a low level, the first enable signal EHSD_EN may be at a high level. Similarly, assuming the first selection signal EVEN is at a low level and the second selection signal ODD is at a high level, the second enable signal OHSD_EN may be at a high level.

The first and second output buffers 230, 240 may be connected to the external terminal 40. The output buffers 230, 240 may receive the data groups EDATA and ODATA, respectively, and may respectively output the corresponding data groups EDATA and ODATA in response to the internal clocks ECLK and OCLK.

The first and second transmitting sections 232, 242 may be coupled to input terminals of the first and second output buffers 230, 240, respectively. The first and second transmitting sections 232, 242 may transmit internal clocks ECLK and OCLK to the output buffers 230, 240 in response to enable signals EHSD_EN and OHSD_EN. The first and second transmitting sections 232 and 242 are illustrated herein by a transmission gate, but any other similar function device may be used, as will be obvious to one of ordinary skill in the art.

The first transmitting section 232 may be enabled when the first enable signal, for example EHSD_EN, is at a second logic level, for example a high level. When the first transmitting section 232 is enabled, the first internal clock, for example ECLK, may be input to the output buffer 230. In response the output buffer 230 may output the first data group EDATA. On the other hand, the second transmitting section 242 may be enabled when the second enable signal, for example OHSD_EN, is at a high level. When the second transmitting section 242 is enabled, the second internal clock, for example OCLK may be input to the output buffer 240. In response the output buffer 240 may output the second data group ODATA.

The semiconductor memory device according to an example embodiment is now described with reference to FIG. 9.

Initially, a test mode may be set when the test mode signal TM_OTFHSD is at a second logic level, for example high logic level.

Next, a READ signal may be input to the semiconductor memory device causing the internal read signal RD_HSD to reach a high level. The test mode signal TM_OTFHSD, the internal read signal RD_HSD, and the control signal CTR may cause the first selection signal EVEN to reach a high level. The first enable signal EHSD_EN may reach a high level in response to the first selection signal EVEN and the second selection signal ODD. When the first enable signal EHSD_EN reaches a high level the first data group EDATA may be output on the external terminal 40.

When a subsequent READ signal is input to the semiconductor memory device, the internal read signal RD_HSD may again reach a high level. The second selection signal ODD may reach a high level in response to the test mode signal TM_OTFHSD, the internal read signal RD_HSD, and the control signal CTR. The second enable signal OHSD_EN may reach a high level in response to the first selection signal EVEN and the second selection signal ODD. When the second enable signal OHSD_EN reaches a high level the second data group ODATA may be output on the external terminal 40.

Figure 10:
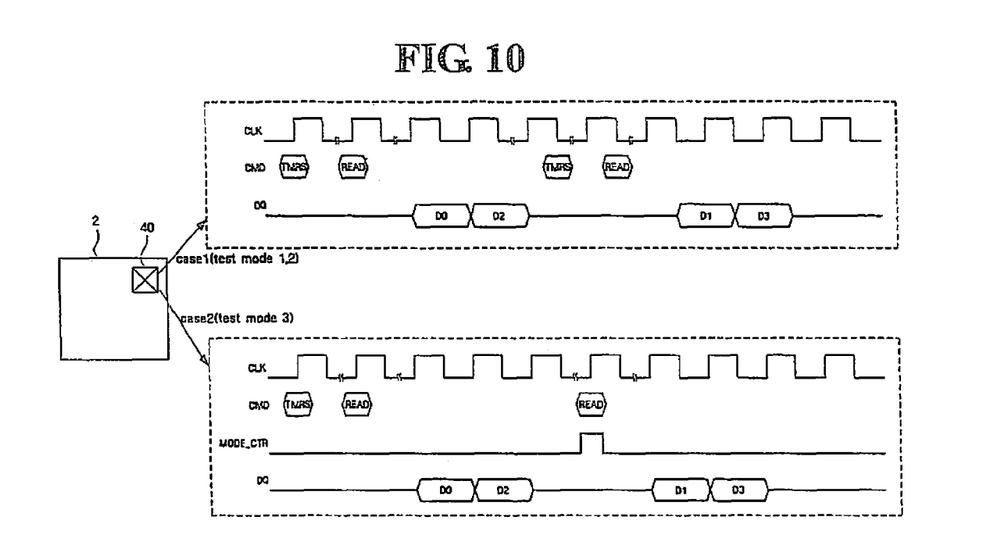
FIG. 10 illustrates a semiconductor memory device according to another example embodiment.
Figure 11:
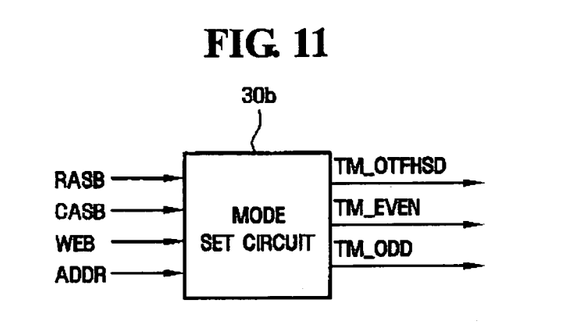
FIG. 11 is an example block diagram illustrating in detail the mode set circuit of FIG. 4 according to another example embodiment.
Figure 12:
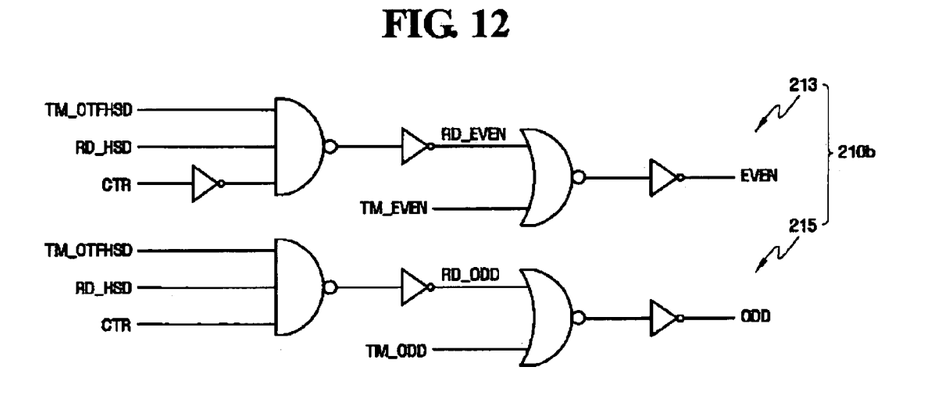
FIG. 12 is an example circuit diagram of the selecting section used of FIG. 6 according to another example embodiment.

A semiconductor memory device according to another example embodiment is described hereafter with reference to FIGS. 10 to 12.

FIG. 10 illustrates a semiconductor memory device according to another example embodiment. FIG. 11 is a block diagram illustrating a mode set circuit of the example embodiment in FIG. 10 and FIG. 12 is an example circuit diagram of a selecting section of the example embodiment of FIG. 10. The components illustrated in example embodiments of FIGS. 11 and 12 are somewhat similar to the components illustrated in the example embodiments of FIGS. 4 to 9 and are referred to by the same reference numerals and detailed description is not provided.

Referring to FIG. 10, a semiconductor memory device 2 according to another example embodiment may use the test mode described in FIG. 2 and FIG. 3.

The semiconductor memory device 2 may include a memory cell array that may output the first and the second data group at a first data rate DR1 in parallel and an output circuit, which in normal mode of operation, may serially output the first and the second data group at the first data rate DR1. In a first test mode of operation the output circuit may output the first data group EDATA at the second data rate DR2, which may be lower than the first data rate DR1, and in a second test mode of operation the output circuit may output the second data group ODATA at the second data rate DR2 (See FIG. 2). Further, according to the example embodiment described in relation to FIG. 3, the output circuit may output the first data group EDATA or the second data group ODATA at the second data rate DR2 in a third test mode.

The semiconductor memory device according to the example embodiment described in relation to FIG. 3 may be embodied similar to non-limiting example embodiment illustrated in FIG. 4. The semiconductor memory device 2 may differ from the example embodiment in FIG. 4 in a mode set circuit (for example FIG. 11) and/or a selecting section (for example FIG. 12).

Referring to FIG. 11, the mode set circuit 30b, in response to a plurality of signals RASB, CASB, WEB, ADDR, may provide a first test mode signal, for example TM_EVEN, a second test mode signal, for example TM_ODD and a third test mode signal, for example, TM_OTFHSD for respectively determining a first, a second and a third test mode of the output circuit.

Referring to FIG. 12, a selecting section 210b may provide selection signals EVEN, ODD for respectively selecting the first data group EDATA or the second group ODATA, in response to the control signal CTR, the first to third test mode signals TM_EVEN, TM_ODD, TM_OTFHSD, and the internal read signal RD_HSD.

The selecting section 210b may include a first sub-selecting section 213 and a second sub-selecting section 215.

The first sub-selecting section 213 may perform a NAND-operation of a signal inverted from the control signal CTR, the third test mode signal, for example TM_OTFHSD, and an internal read signal RD_HSD. The result of the NAND operation may be inverted to output signal RD_EVEN. The signal RD_EVEN and the first test mode signal, for example TM_EVEN may further undergo a NOR-operation to output a first selection signal, for example EVEN. The second sub-selecting section 215 may perform a NAND-operation of the control signal CTR, the third test mode signal, for example TM_OTFHSD, and an internal read signal RD_HSD. The result of the NAND operation may be inverted to output signal RD_ODD. The signal RD_ODD and the second test mode signal TM_ODD may further undergo a NOR-operation to output a second selection signal, for example ODD.

Accordingly, the first selection signal, for example selection signal EVEN, may reach a logic high level when the first test mode signal, for example TM_EVEN is at a first logic level, for example a logic high level and the second selection signal, for example selection signal ODD, may reach a logic high level when the second test mode signal, for example TM_ODD is at a first logic level, for example logic high level.

A semiconductor memory device according to the above specified example embodiments may output a first data group and a second data group on an external terminal without changing the test mode. It is therefore possible to reduce the test time considerably.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor memory device comprising:
a memory cell array outputting at least one of a first and a second data group at a first data rate;
an output circuit, wherein the output circuit, in a normal mode of operation, serially outputs at least one of the first and the second data group at the first data rate, and in a first test mode outputs the first data group at a second data rate, in a second test mode outputs the second data group at the second data rate, and in a third test mode outputs the first data group or the second data group at the second data rate in response to at least one control signal; and
a test mode set circuit outputting a first, a second and a third test mode signal for respectively determining the first, second and third test mode of the output circuit, in response to a plurality of input signals, wherein the output circuit includes,
a selecting section, wherein the selection section outputs at least one selection signal for selecting the first data group or the second data group, in response to at least the control signal, at least two of the first, second or third test mode signals, and the internal read signal, wherein the selecting section includes, a first sub-selecting section that performs a first logic operation on an inverted signal of the control signal, at least one test mode signal of the at least two test mode signals, and the internal read signal, and performs a second logic operation on the output of the first logic operation and at least one another test mode signal of the at least two test mode signals, the first sub-selecting section outputting a first selection signal based on the first and second logic operations, and a second sub-selecting section that performs a third logic operation on the control signal, at least one test mode signal of the at least two test mode signals, and the internal read signal, and performs a fourth logic operation on the output of the third logic operation and at least one another test mode signal of the at least two test mode signals, the second sub-selecting section outputting a second selection signal based on the third and fourth logic operations; and a buffering section outputs the first data group in response to the first selection signal and outputs the second data group in response to the second selection signal.

2. The semiconductor memory device of claim 1, wherein the second data rate in the first, second and the third test mode is lower than the first data rate.

3. The semiconductor memory device of claim 1, wherein the at least one control signal is an address signal.

4. The semiconductor memory device of claim 1, wherein the output circuit outputs the first data group when the control signal is at a first logic level, and the second data group when the control signal is at a second logic level.

5. The semiconductor memory device of claim 1, wherein the buffering section comprises:

a calculating section that generates at least one enable signal in response to the at least one selection signal;

at least two output buffers connected to the external terminal in parallel, each of the at least two output buffers outputting at least one of the two data groups in response to at least one internal clock; and at least one transmitting section connected to each of the at least two output buffers and transmitting the at least one internal clock to the at least two output buffers in response to the at least one enable signal.

* * * * *